Figure 1:
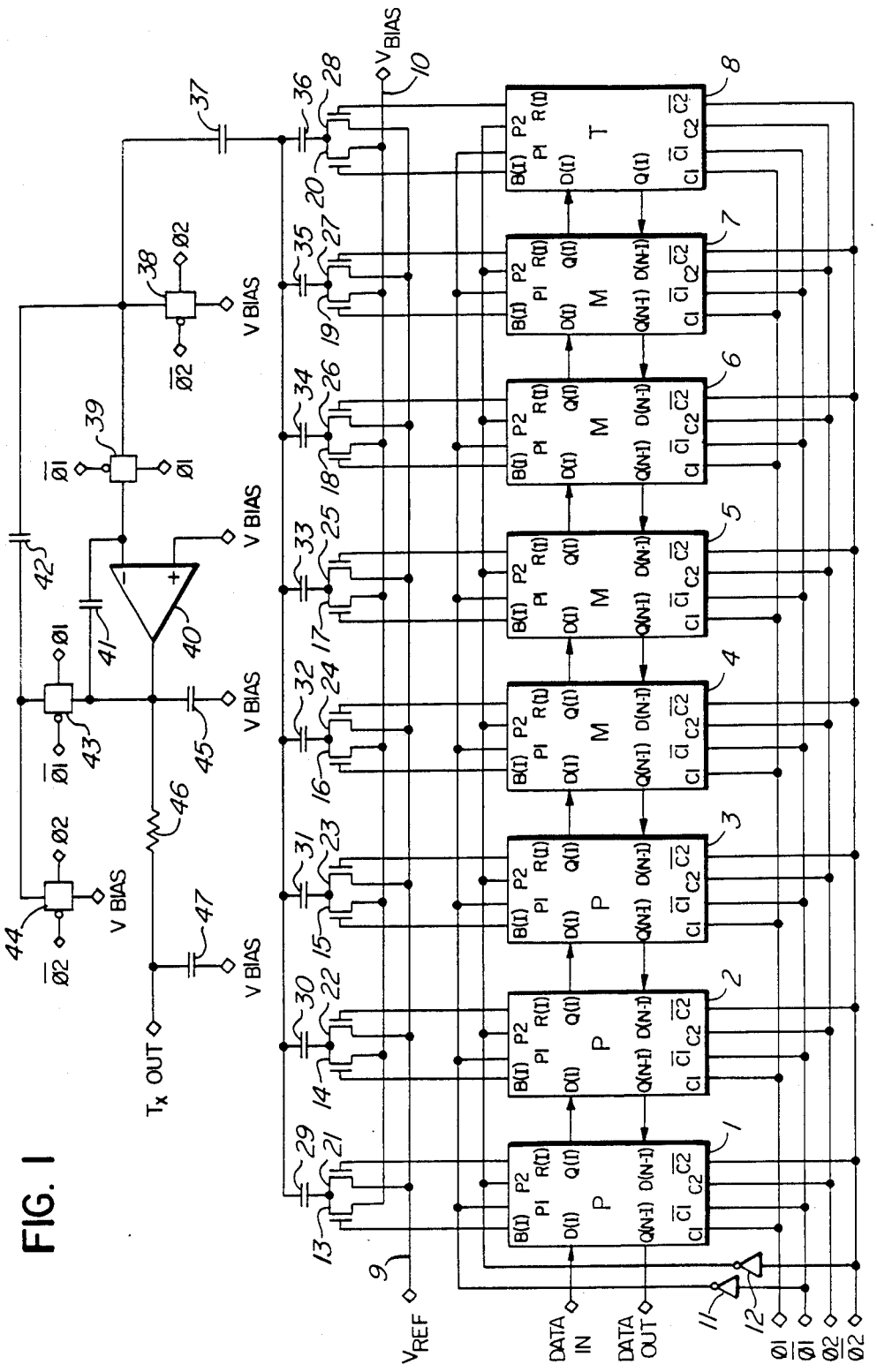

United States Patent [19]

Gillingham

[11] Patent Number: 4,751,666
[45] Date of Patent: Jun. 14, 1988

[54] SWITCHED CAPACITOR FINITE IMPULSE RESPONSE FILTER

[75] Inventor: Peter Gillingham, Ottawa, Canada

[73] Assignee: Mitel Corporation, Kanata, Canada

[21] Appl. No.: 783,559

[22] Filed: Oct. 3, 1985

[30] Foreign Application Priority Data

May 27, 1985 [CA] Canada ................................. 482497

[51] Int. Cl.$^4$ .............................................. G06J 1/06
[52] U.S. Cl. .................................................. 364/602
[58] Field of Search ............... 364/724, 825, 602, 606, 364/807; 370/77, 70; 333/173, 165, 176; 340/347 DA; 307/260, 239

[56] References Cited

U.S. PATENT DOCUMENTS

| | | | |
|---|---|---|---|
| 4,300,229 | 11/1981 | Hirosaki | 370/70 |
| 4,302,631 | 11/1981 | Shenoi et al. | 364/724 X |
| 4,356,464 | 10/1982 | Fettweis | 364/825 X |
| 4,359,778 | 11/1982 | Lee | 364/825 X |
| 4,507,725 | 3/1985 | Christopher et al. | 364/745 X |
| 4,574,392 | 3/1986 | Reiss | 381/51 |
| 4,625,293 | 11/1986 | Vogelsong et al. | 364/606 |
| 4,630,204 | 12/1986 | Mortara | 364/417 |
| 4,633,425 | 12/1986 | Senderowicz | 364/825 |
| 4,649,505 | 3/1987 | Zinser et al. | 364/724 X |
| 4,653,017 | 3/1987 | Colbeck et al. | 369/724 X |
| 4,654,815 | 3/1987 | Marin et al. | 364/606 |
| 4,658,358 | 4/1987 | Blais | 364/572 |
| 4,661,948 | 4/1987 | Shapiro et al. | 370/77 |
| 4,667,298 | 5/1987 | Wedel, Sr. | 364/724 X |

*Primary Examiner*—Joseph Ruggiero
*Assistant Examiner*—Charles B. Meyer
*Attorney, Agent, or Firm*—Sandler & Greenblum

[57] ABSTRACT

A symmetric finite impulse response filter for receiving a digital input signal and generates a filtered analog output signal for application to a balanced line, such as a tip and ring lead pair. Logic levels of predetermined symmetrical bit pairs of the digital input signal are detected and in response, predetermined corresponding capacitors are selectively switched between bias and reference voltages, thereby charging predetermined voltages proportional to the capacitances of the capacitors. The predetermined voltages are summed in an operational amplifier which, in response produces a filtered analog output signal. Individual capacitors are utilized for realizing each pair of symmetrical coefficients of the filter transfer function, resulting in considerable economy of size. A switched capacitor implementation results in high speed performance, simple design and low cost.

28 Claims, 4 Drawing Sheets

SWITCHED CAPACITOR FINITE IMPULSE RESPONSE FILTER

The present invention relates in general to filters, and in particular to a switched capacitor symmetric finite impulse response filter.

Filters are typically designed to meet various specifications or requirements related to a particular application. For example, in telephony it is desired that line and transhybrid impulse responses be optimized for transmission of signals on a balanced line, such as a twisted tip and ring lead pair. In the case of digital signal transmission, the signal is required to be band-limited within a predetermined pass-band of frequencies related to the transmission baudrate, conforming to predetermined lower and upper stopband attenuation specifications. In addition, the amplitude spectrum of a transmitted signal is required to exhibit predetermined attenuation in secondary lobes thereof with respect to the amplitude of signals in the primary lobe.

Digital filters have been designed to meet these criteria and have been classified in terms of the duration of their impulse responses, into two broad categories: infinite impulse response (IIR) and finite impulse response (FIR) filters. An FIR filter is one in which the impulse response is limited to a finite number of samples, and is defined in the complex frequency z-domain by a well known transfer function, as follows:

$$H(z) = \sum_{n=0}^{N} h(n) z^{-n}$$

where h(n) designates the impulse response defined over a finite number of samples "n" ranging from zero to "N" (the order of the filter), and "$z^{-n}$" designates a series of n delay elements of the filter.

FIR filters have been designed which embody the characteristics of linear phase and low susceptibility to parameter quantization effects, characteristics which are advantageous in transmitting digital signals along a balanced line since intersymbol interference is substantially eliminated. Also, FIR filters are easily implemented in non-recursive realizations, whereas IIR filters typically require one or more feedback paths.

The aforementioned linear phase characteristics have been realized by constructing symmetric FIR filters with impulse response coefficients conforming to the following relation:

$$h(N) = h(N-n), 0 \leq n \leq N$$

where the impulse response h(n) of a transmitted signal is seen to be proportional to the number of coefficients N in the filter transfer function.

Prior art digital FIR filters were typically implemented algorithmically in a computer, by executing programs for performing a direct convolution or fast Fourier transform (FFT) on a digital input signal. According to these programs, a large number of calculations were required to be performed, such as multiplications, delays and summations, etc., resulting in substantially lengthy execution times of the programs. Hence, prior art computer implemented digital filters typically did not operate in real-time.

More recently, dedicated digital FIR filter integrated circuits have become available for implementing the aforementioned FFT programs without the aid of a computer. These integrated circuits typically utilize logic array circuitry for performing high speed calculations. While these circuits are capable of operating in real-time, a large amount of transistor-transistor logic (TTL) circuitry is required, which consumes considerable power.

Prior art analog symmetric FIR filters were typically implemented using switched capacitor arrays. A predetermined number of capacitors were switched alternately between sources of reference and bias voltage in response to logic high and low levels of corresponding bits of the digital input signal.

The prior art analog FIR filters operated at higher speed and with less power consumption than the prior art digital implementations. However, each capacitor corresponded to a respective coefficient of the transfer function. Thus, a large capacitor array was required to be fabricated, requiring considerable area. Also, since fabrication of the capacitor arrays is process dependent, it was found that capacitor pairs which correspond to the symmetrical pairs of equal valued transfer function coefficients were frequently imperfectly matched due to over-etching or under-etching of the capacitors. Hence, the symmetrical pairs of coefficients of the transfer function were not perfectly matched, resulting in non-linear phase characteristics and poor digital signal transmission performance.

According to the present invention, logic levels of symmetric bit pairs of the digital input signal are detected for controlling operation of a switched capacitor array which consumes little power and operates at high speed (i.e. in real-time), thereby overcoming the disadvantages of the high-power algorithmic TTL filters and time intensive prior art computer implemented algorithmic FIR filters.

In the event both bits of any one of the symmetrical bit pairs have the same logic levels, a corresponding capacitor in the switched capacitor array is charged to a predetermined voltage. However, in the event the bits have opposite logic levels, the corresponding capacitor is maintained discharged, thereby effectively eliminating a computational step (i.e. multiplication) in realizing the filter, as discussed in greater detail below with reference to the drawings.

In general, the invention is a symmetric finite impulse response filter characterized by a predetermined transfer function having a plurality of predetermined symmetric coefficient pairs, comprised of circuitry for receiving an input signal comprising a sequence of bits having predetermined logic levels, and a plurality of capacitors having respective capacitances proportional to corresponding ones of the coefficient pairs, and having first terminals thereof connected together. The invention also includes circuitry for successively detecting the logic levels of the received bits and successively charging first predetermined ones of the capacitors to one of a positive or negative voltage via second terminals thereof in the event individual bits of first predetermined pairs of the received bits corresponding to first ones of the corresponding predetermined coefficient pairs are of the same logic level, and maintaining further ones of the capacitors discharged in the event individual bits of further pairs of the received bits corresponding to further predetermined ones of the corresponding coefficient pairs are of opposite logic level. In addition, the invention comprises circuitry connected to the first terminals of the plurality of capacitors for successively summing the voltages on the capacitors and generating an output signal in response thereto, whereby the output signal is an analog version of the digital input signal filtered according to the predetermined transfer function.

More particularly, the invention is a symmetric finite impulse response filter characterized by a predetermined transfer function having a plurality of positive and negative coefficient pairs, comprised of a plurality of serially connected shift registers for receiving and storing an input sequence of bits a plurality of first and second logic circuits connected to first and second predetermined ones of the shift registers, for detecting logic levels of first and second predetermined pairs of the received bits corresponding to respective ones of the positive and negative coefficient pairs, and generating control signals in response thereto. The invention is further comprised of a plurality of capacitors having respective capacitances proportional to corresponding ones of the coefficient pairs, and having first terminals thereof connected together. In addition, the invention is comprised of a plurality of switches connected to respective ones of the plurality of first and second logic circuits and second terminals of respective ones of the capacitors, for receiving the control signals, and (i) charging first predetermined ones of capacitors to a positive voltage in response to reception of a first predetermined one of the control signals, (ii) charging second predetermined ones of the capacitors to a negative voltage in response to reception of a second predetermined one of the control signals, and (iii) discharging further predetermined ones of the capacitors in response to reception of a third predetermined one of the control signals. The invention further comprises an integrator connected in a circuit to the first terminals of the capacitors for receiving and summing the voltages on the capacitors and generating an analog output signal in response thereto, whereby the charging and discharging of the capacitors filters the input sequence of bits according to the transfer function and the integrator converts the filtered sequence of bits to analog form.

Figure 2:
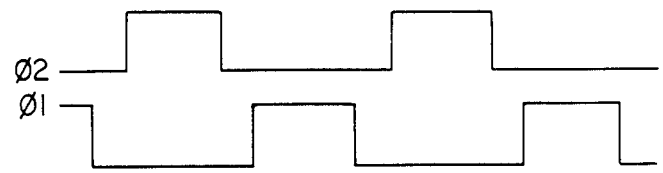
Figure 3:
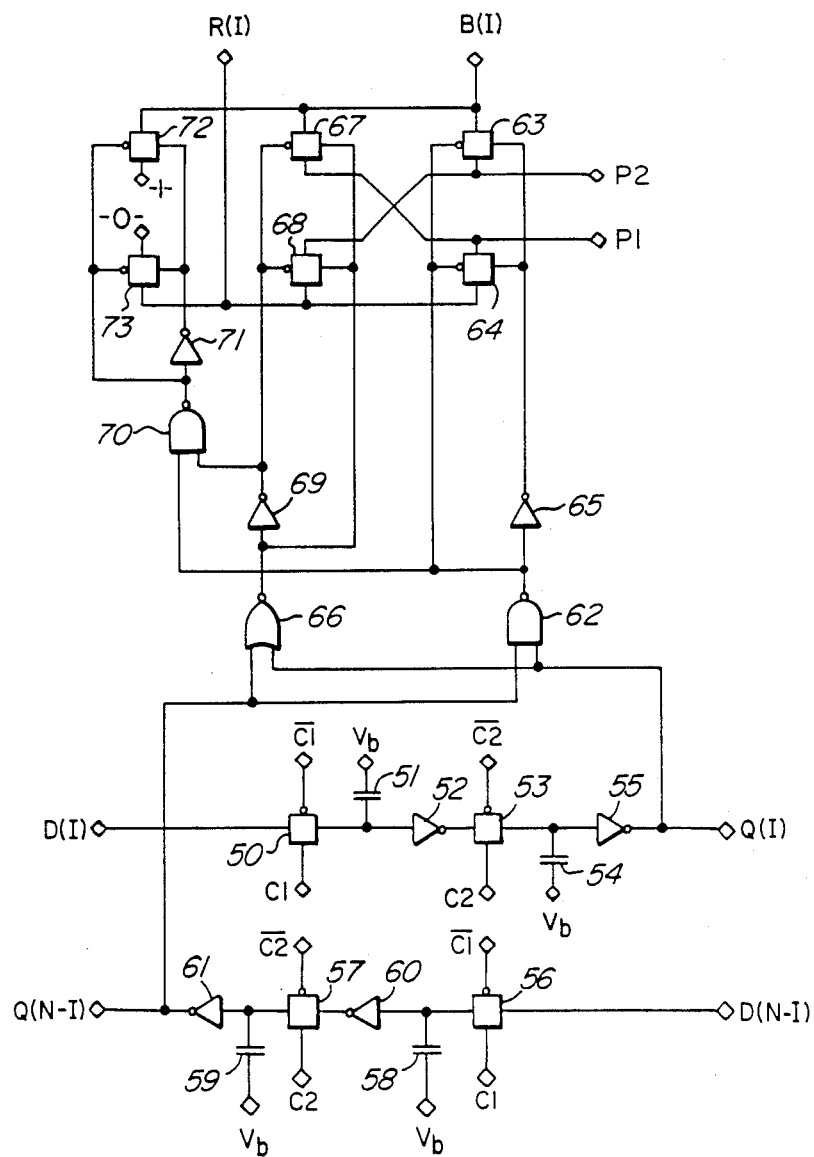
Figure 4:
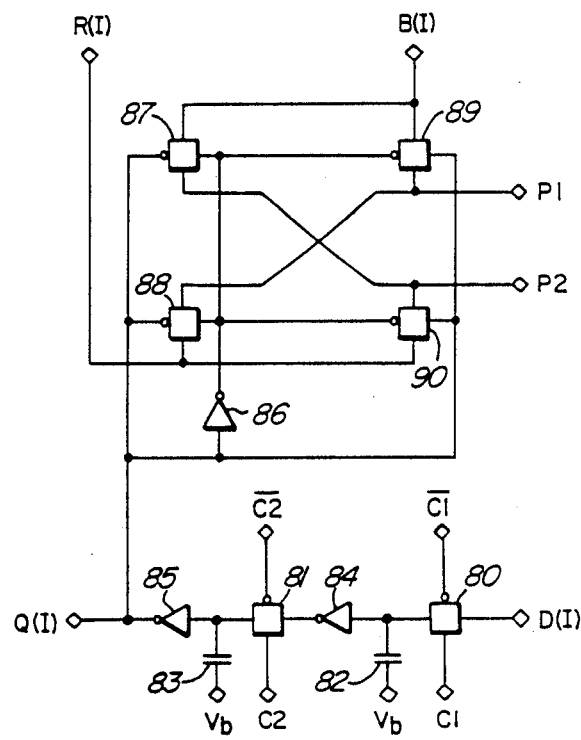
Figure 5A:
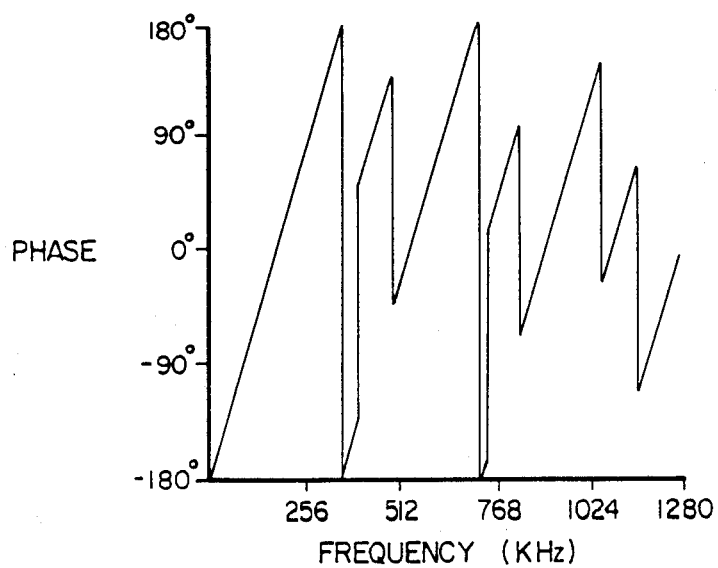
Figure 5B:
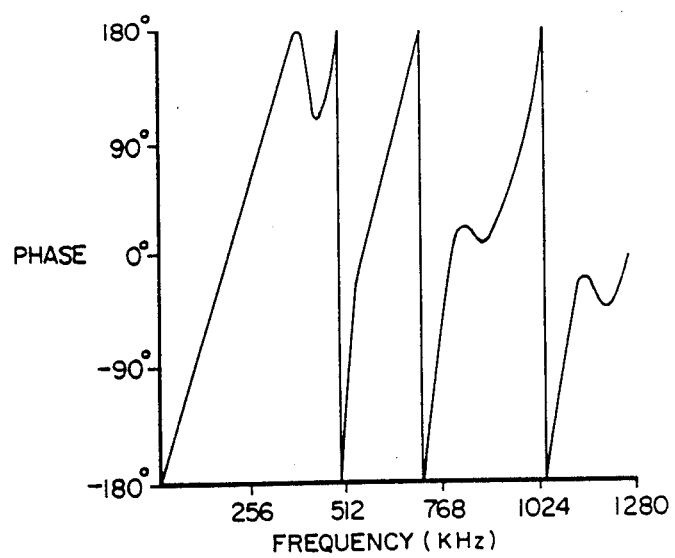

A better understanding of the invention will be obtained by reference to the detailed description below in conjunction with the following drawings, in which:

FIG. 1 is a schematic diagram according to a preferred embodiment of the invention, FIG. 2 is a timing diagram of non-overlapping clock signals, according to the preferred embodiment, FIGS. 3 and 4 are schematic diagrams of digital processing circuits according to the preferred embodiment, and FIGS. 5A and 5B are phase response graphs of filters according to a successful prototype of the present invention and the prior art, respectively.

With reference to FIG. 1, a plurality of digital processing circuits 1-8 are shown having clock inputs C1, $\overline{C1}$, C2 and $\overline{C2}$ thereof for receiving clock signals $\phi 1$, $\overline{\phi 1}$, $\phi 2$ and $\overline{\phi 2}$ respectively. Inverted versions of the $\overline{\phi 1}$ and $\overline{\phi 2}$ clock signals are applied to P1 and P2 inputs of circuits 1 to 8 via inverters 11 and 12 respectively.

Circuits 1, 2 and 3 are designated by the letter "P", indicating that they function as "plus" type processing circuits, as described in detail below. Likewise, circuits 4, 5, 6 and 7 are designated by the letter "M", indicating that they function as "minus" type processing circuits. Circuit 8 is designated by the letter "T", indicating that it functions as a "turn-around" circuit.

The Q(I) and Q(N-I) outputs of respective ones of the circuits 1-7 are connected to D(I) and D(N-I) inputs respectively, of adjacent ones of the circuits 1-7. However, "T" circuit 8 has a Q(I) output thereof connected to the D(N-1) input of the adjacent "M" circuit 7, as discussed in greater detail below. According to the preferred embodiment, the bias voltage source $V_{BIAS}$ is at approximately ground potential.

In operation, successive data bits of a digital input signal are received on a DATA IN terminal and applied to the D(I) input of circuit 1 and appear on the Q(I) output thereof in response to clock signals being received on the C1, $\overline{C1}$, C2 and $\overline{C2}$ inputs. The data bits propagate from the Q(I) outputs of individual ones of circuits 1-7 to the D(I) inputs of adjacent circuits 2-8 in response to the circuits 1-7 receiving the aforementioned clock signals. Data bits appearing on the Q(I) output of circuit 8 are applied to the D(N-I) input of circuit 7, and successive bits propagate in a reverse direction from the Q(N-I) output of individual ones of circuits 7-2 to the D(N-I) inputs of adjacent circuits 6-1, respectively. Data bits appearing on the Q(N-I) output of circuit 1 are applied to a DATA OUT terminal.

A data bit which propagates from circuit 1-8 and back, is delayed by fifteen clock cycles of the clock signals $\phi 1$, $\overline{\phi 1}$, $\phi 2$ and $\overline{\phi 2}$. Thus, circuits 1-8 function in one capacity as shift registers.

Clock signals $\phi 1$ and $\phi 2$ are preferably non-overlapping rectangular signals, as described in greater detail with reference to FIG. 2, and clock signals $\overline{\phi 1}$ and $\overline{\phi 2}$ are logical compliment signals of the clock signals $\phi 1$ and $\phi 2$, respectively. According to the preferred embodiment, the clock signals have a frequency of approximately sixteen times the transmission baudrate frequency of the digital input signal. According to the successful prototype, the baudrate was 160 kHz and the clock signal frequency was 2.56 MHz.

The logic levels of the data bits appearing on the Q(I) and Q(N-I) outputs of individual ones of circuits 1-8 are detected by internal logic circuitry associated therewith, as described in greater detail below with reference to FIGS. 3 and 4. In response to detection of the logic levels, the inverted $\phi 1$ or $\phi 2$ clock signals received on the P1 and P2 inputs are further applied to respective ones of the B(I) and outputs, as illustrated in TRUTH TABLES 1, 2 and 3 below. Alternatively, the R(I) outputs of circuits 1-7 can be connected to the negative supply (logical '0') and the B(I) output can be connected to the positive supply (logical '1') as shown in TRUTH TABLES 1 and 2.

TRUTH TABLE 1

| "P" TYPE CIRCUITS | | | |
|---|---|---|---|
| Q (I) | Q (N-I) | R (I) | B (I) |
| 0 | 0 | $\phi 2$ | $\phi 1$ |
| 0 | 1 | 0 | 1 |
| 1 | 0 | 0 | 1 |
| 1 | 1 | $\phi 1$ | $\phi 2$ |

TRUTH TABLE 2

| "M" TYPE CIRCUITS | | | |
|---|---|---|---|
| Q (I) | Q (N-I) | R (I) | B (I) |
| 0 | 0 | $\phi 1$ | $\phi 2$ |
| 0 | 1 | 0 | 1 |
| 1 | 0 | 0 | 1 |

TRUTH TABLE 2-continued

| "M" TYPE CIRCUITS | | | |
|---|---|---|---|
| Q (I) | Q (N-I) | R (I) | B (I) |
| 1 | 1 | O2 | O1 |

TRUTH TABLE 3

| "T" TYPE CIRCUITS | | |
|---|---|---|
| Q (I) | R (I) | B (I) |
| 0 | O1 | O2 |
| 1 | O2 | O1 |

The B(I) outputs of circuits 1-8 are connected to gate terminals of MOS transistors 13-20 respectively, and the R(I) outputs of circuits 1-8 are connected to the gate terminals of MOS transistors 21-28 respectively. Drain terminals of transistors 13-20 are connected to the source of bias voltage $V_{BIAS}$ via lead 10, and drain terminals of transistors 21-28 are connected to the source of reference voltage $V_{REF}$ via lead 9. Source terminals of transistor pairs 13 and 21, 14 and 22, ... 20 and 28 are connected together and to individual first terminals of respective capacitors 29-36. Further terminals of each of capacitors 29-36 are connected together and to a first terminal of an attenuating capacitor 37.

A second terminal of capacitor 37 is connected via transmission gate 38 to the source of bias voltage $V_{BIAS}$, and via transmission gate 39 to an inverting input of an operational amplifier 40. Transmission gates 38 and 39 are preferably well known CMOS transmission gates, each having a PMOS disable input and NMOS enable input, for receiving the $\phi 2$, $\overline{\phi 2}$ and $\phi 1$, $\overline{\phi 1}$ clock signals respectively. The output of operational amplifier 40 is connected to the inverting input thereof via capacitor 41 and also via a transmission gate 43, level holding capacitor 42 and transmission gate 39. A further transmission gate 44 is connected to level holding capacitor 42 and the source of bias voltage $V_{BIAS}$, and is enabled in response to a low to high transition of the $\phi 2$ clock signal.

As discussed above, an FIR filter is characterized by the transfer function:

$$H(z) = \sum_{n=0}^{N} h(n) z^{-n}$$

According to the preferred embodiment illustrated in FIG. 1, N=14 and fifteen multiplications and fourteen summations are performed as follows:

$$H(z) = h(0)z^0 + h(1)z^{-1} + h(2)z^{-2} - h(3)z^{-3}$$
$$-h(4)z^{-4} - h(5)z^{-5} - h(6)z^{-6} - h(7)z^{-7} - h(6)z^{-8}$$
$$-h(5)z^{-9} - h(4)z^{-10} - h(3)z^{-11}$$
$$+h(2)z^{-12} + h(1)z^{-13} + h(0)z^{-14},$$

or $$H(z) = h(0)[z^0 + z^{-14}] + h(1)[z^{-1} + z^{-13}]$$
$$+h(2)[z^{-2} + z^{-12}] - h(3)[z^{-3} + z^{-11}]$$
$$-h(4)[z^{-4} + z^{-10}] - h(5)[z^{-5} + z^{-9}]$$
$$-h(6)[z^{-6} + z^{-8}] - h(7)z^{-7},$$

Thus, by grouping pairs of delayed input data bits for multiplication by common coefficients, the number of multiplications is reduced to eight from fifteen.

Since the number of multiplications has been reduced by approximately one half, the implementation of this FIR filter results in significantly improved time performance specifications over prior art algorithmic FIR filters. Also, in the event the logic levels of input data bits appearing on the Q(I) and Q(N-I) outputs of a particular one or more of the circuits 1-7 are different, the corresponding multiplication (ie. capacitor charging) is eliminated altogether, resulting in further improvements in time performance specifications, as described in detail below.

Operation of "P" type digital processing circuit 1, with reference to FIG. 1, TRUTH TABLE 1 and FIG. 2, is as follows: the $\phi 2$ clock signal is applied to the R(I) output and the $\phi 1$ signal is applied to the B(I) output of circuit 1 in the event the logic levels of the bits appearing on the Q(I) and Q(N-I) outputs are both low (i.e. logic low voltage). Accordingly, in response to a low to high transition of the $\phi 2$ clock signal, transistor 21 is biased on and the second terminal of attenuating capacitor 37 is simultaneously connected to the source of bias voltage $V_{BIAS}$ via transmission gate 38. Momentarily disregarding the effect of capacitors 30-36 on circuit operation, it is seen that the series capacitor combination of capacitors 29 and 37 is charged to a level Q=aCV$_{REF}$, where "Q" represents the charge stored on capacitors 29 and 37, and "aC" represents the series capacitance of the combination of capacitors 29 and 37.

Next, upon a high to low transition of the $\phi 2$ clock signal, but prior to a low to high transition of the $\phi 1$ clock signal (bearing in mind $\phi 1$ and $\phi 2$ are non-overlapping), transmission gate 38 is disabled and both transistors 13 and 21 are biased off. Hence, the combination of capacitors 29 and 37 is effectively open circuited and retains the charge Q stored thereon.

Transmission gates 39 and 43 and transistor 13 are enabled in response to a low to high transition of the $\phi 1$ clock signal, and transistor 21 and transmission gates 38 and 44 remain off. Hence, the capacitor combination of capacitors 29 and 37 discharges to the voltage level of the source of bias voltage $V_{BIAS}$, through operational amplifier 40, thereby charging capacitor 41, and capacitor 42 via transmission gate 43.

By superposition, each of the capacitors 30-36 operating in an identical manner to capacitor 29, contribute to the charging of capacitors 41 and 42, as discussed in greater detail below.

The charge Q stored on capacitors 41 and 42 is maintained across amplifier 40 pursuant to a subsequent high to low transition of the $\phi 1$ clock signal. Accordingly, amplifier 40 in conjunction with the capacitors 41 and 42 operates as an integrator circuit, in a well known manner.

The next low to high transition of the $\phi 2$ clock signal causes capacitor 42 to discharge to the voltage level of bias voltage source $V_{BIAS}$ and the input digital signal data bits are simultaneously clocked for transmission to the adjacent ones of circuits 1-8, and the entire process is repeated.

The $\phi 1$ and $\phi 2$ clock signals are non-overlapping in order that short circuit paths are not inadvertently established between the $V_{REF}$ and $V_{BIAS}$ voltage sources through the aforementioned transistor pairs.

In the event the logic levels of the bits appearing on the Q(I) and Q(N-I) outputs of circuit 1 are both high (i.e. logic high voltage), the $\phi 1$ and $\phi 2$ clock signals are applied to the R(I) and B(I) outputs of circuit 1 respectively. Hence, in response to a low to high transition of the $\phi 2$ clock signal, transistor 13 is biased on and transmission gate 38 is enabled such that the capacitor combination 29 and 37 is discharged. Subsequently, in response to a low to high transition of the $\phi 1$ clock signal, transmission gate 38 is disabled, transmission gate 39 is enabled, transistor 13 is biased off and transistor 21 is biased on. Hence, the combination of capacitors 29, 37, 41 and 42 charge to the level of reference voltage source $V_{REF}$, via lead 9, (i.e. $Q = -aCV_{REF}$, with reference to the output of amplifier 40).

The voltages appearing on the output of amplifier 40 are proportional to the charge stored thereacross on capacitors 41 and 42, divided by the total capacitance of capacitors 29, 37, 41 and 42, (disregarding again the effects of capacitors 30–36). For instance, in the event the bits on the Q(I) and Q(N-I) outputs of circuit 1 are both at logic low levels and the total capacitance of capacitors 41 and 42 is "C", and the total capacitance of capacitors 29 and 37 is "aC", then the charge "Q" stored in response to a low to high transition of the $\phi 2$ clock signal is $Q = aCV_{REF}$, as discussed above. Similarly, the voltage appearing at the output of amplifier 40 is $V_o = Q/C = aV_{REF}$. Hence, the output voltage of amplifier 40 is proportional to the reference voltage $V_{REF}$ by a proportionality constant "a", corresponding to the ratio of capacitances of the combination of capacitors 29 and 37 to the combination of capacitors 41 and 42.

Similarly, in the event the bits on the Q(I) and Q(N-I) outputs of circuit 1 are both at logic high levels, the voltage appearing on the output of amplifier 40 is $V_o = -aV_{REF}$.

In the event the bits stored on the Q(I) and Q(N-I) outputs of circuit 1 are different (i.e. a logic high and a logic low level respectively), the B(I) output is connected to logical '1' and the R(I) output is connected to logical '0'. Transistor 13 is thus enabled for the entire cycle of clock signals $\phi 1$ and $\phi 2$ such that the capacitors 29, 37, 41 and 42 do not charge. This effectively eliminates one of the FIR filter multiplications, as discussed above.

Circuits 2 and 3 operate in an identical manner as circuit 1 discussed above and individual ones of circuits 4, 5, 6 and 7 also operate in an idential manner except that the application of the $\phi 1$ and $\phi 2$ clock signals to the B(I) and R(I) outputs is reversed relative to the "P" type circuits, as shown in TRUTH TABLE 2, above. Hence, in the event the bits appearing on the Q(I) and Q(N-I) outputs of a particular one of the "M" type circuits, for example circuit 4, are both at logic low levels, the output of amplifier 40 generates a negative output voltage $V_o = -aV_{REF}$, (disregarding the effect of capacitors 29–31 and 33–36). Likewise, in the event the bits appearing on the Q(I) and Q(N-I) outputs of a particular one of the "M" type circuits are both at logic high levels, the output of amplifier 40 generates a positive output voltage, $V_o = aV_{REF}$.

With reference to the "T" type circuit 8, it is seen that the B(I) and R(I) outputs are always connected to one of the $\phi 1$ or $\phi 2$ clock signals which incorporate the same phase relationship for application to the R(I) and B(I) outputs as in "M" type circuits 4, 5, 6 and 7, since "$-h(7)z^{-7}$" corresponds to a negative coefficient.

As discussed above, operation of circuit 1 has been considered without regard to the effect of capacitors 30–36, for ease of description. However, since capacitors 29–36 are each connected together and to capacitor 37, each one of the capacitors contributes to the total charge Q, by the principle of superposition. Hence, because each of the circuits 1–8 operates simultaneously, the charges developed across individual ones of the capacitors 29–36 vary in accordance with the logic levels of bits appearing on the Q(I) and Q(N-I) outputs of corresponding ones of circuits 1–8. Thus, the charges developed across capacitors 29 to 36 are summed at the inverting input of operational amplifier 40, which is at a virtual ground and thus acts as a summing node.

Individual ones of capacitors 29–35 have capacitances proportional to twice the values of the coefficients in corresponding coefficient pairs of the aforementioned transfer function, since each coefficient is effectively multipled by two in the event the logic levels of bits appearing on the corresponding Q(I) and Q(N-I) outputs of ones of circuits 1–7 are the same.

Attenuating capacitor 37 limits the amount of voltage applied to the inverting input of operational amplifier 40. In the successful prototype, the total capacitance of capacitors 29–36 was approximately 10.2 picofarads and the total integrating capacitance of capacitors 41 and 42 was approximately 0.6 picofarads, resulting in a proportionality factor "a" of $10.2/0.6 = 17$ which would, in the absence of attenuation, result in generation of an output voltage $V_o = 17V_{REF}$, which is sufficiently large to saturate operational amplifier 40. The effect of attenuating capacitor 37 is to adjust the apparent cumulative capacitance of capacitors 29–36 to be approximately 0.3 picofarads, in order that amplifier 40 does not become saturated.

Holding capacitor 41 is typically smaller than capacitor 42, which is switched between the output of amplifier 40 and the source of bias voltage $V_{BIAS}$, in order to hold the generated output voltage $V_o$ at a constant level throughout each cycle of the $\phi 1$ and $\phi 2$ clock signals. The inclusion of smaller capacitance 41 results in an additional pole in the transfer function of the filter. However, the frequency of the pole is sufficiently higher than the frequency of the clock signals $\phi 1$ and $\phi 2$ so as to cause negligible effect on the frequency response of the filter. In the successful prototype, the additional pole contributed approximately 0.6 dB of attenuation at twice the baudrate frequency of the digital input signal.

An additional capacitor 45 is connected between the output of amplifier 40 and the source of bias voltage $V_b$, in order to ensure operating stability of amplifier 40, in a well known manner.

Also, a low pass filter comprised of a resistor 46 and capacitor 47, is connected to the output of amplifier 40, for smoothing discrete steps in the output voltage $V_o$ between successive cycles of the clock signals $\phi 1$ and $\phi 2$, also in a well known manner.

The low pass filter contributes a further pole which, in the successful embodiment occurred at 513 kHz independent of the baudrate, adding approximately 0.4 dB of attenuation at 160 kHz.

With reference to FIG. 3, the internal circuitry of "P" type circuits 1, 2 and 3 is shown. An input data bit on the D(I) input is applied to transmission gate 50 which is enabled in response to receiving $\phi 1$ and $\overline{\phi 1}$ clock signals. The bit is stored on capacitor 51 in response to being gated through transmission gate 50. The input bit is buffered by inverter 52 and applied to an input of transmission gate 53 for storage on capacitor 54 in response to a subsequent low to high transition of the $\phi 2$ clock signal. The bit is then buffered and rectified in inverter 55 and applied to the Q(I) output.

Similarly, an input data bit appearing on the D(N-I) input is applied via transmission gates 56 and 57, capacitors 58 and 59 and inverters 60 and 61 to the Q(N-I) output in an identical manner.

In the event the bits stored on the Q(I) and Q(n-I) output terminals are both at logic high levels, the output of NAND gate 62 goes low, thereby enabling transmission gates 63 and 64 via disable inputs thereof, and via inverter 65 connected to enable inputs thereof.

The $\phi1$ clock signal is applied to the R(I) output terminal via the P1 input and transmission gate 64, and the $\phi2$ clock signal is applied to the B(I) output terminal via the P2 input and transmission gate 63.

In the event the bits stored on the Q(I) and Q(N-I) output terminals are both at logic low levels, the output of NOR gate 66 generates a logic high signal which is applied to enable inputs of transmission gates 67 and 68, and via inverter 69 to disable inputs thereof. Consequently, the $\phi1$ clock signal is applied to the B(I) output terminal and the $\phi2$ clock signal is applied to the R(I) output terminal.

In the event the bits stored on the Q(I) and Q(N-I) terminals are of opposite logic levels, NAND gate 70 generates a logic low signal which is applied to the disable inputs of transmission gates 72 and 73, and via inverter 71 to the enable inputs thereof. Consequently, a logical '1' voltage connected via transmission gate 72 to the B(I) output terminal, and a logical '0' voltage is connected via transmission gate 73 to the R(1) output terminal.

The "M" type circuits 4-7 are of identical structure and operate identically to the circuit illustrated in FIG. 3 with the exception that the $\phi1$ and $\phi2$ clock signals are applied to opposite ones of the P1 and P2 inputs than for the "P" type circuits 1-3, in order to implement multiplications by negative coefficients of the transfer function, as discussed above.

With reference to FIG. 4, the internal circuitry of "T" type circuit 8 is shown. In particular, input data bits appearing on the D(I) input terminal are translated to the Q(I) output terminal via transmission gates 80 and 81, capacitors 82 and 83, and inverting buffers 84 and 85 in response to reception of clock signals on the C1, $\overline{C1}$, C2 and $\overline{C2}$ terminals in a similar manner as discussed above with reference to FIG. 3. In the event an input bit stored on the Q(I) output terminal is at a logic low level, transmission gates 87 and 88 are enabled, via inverting buffers 86. In the event the bit stored on the Q(I) output terminal is at a logic high level, transmission gates 89 and 90 are enabled in response to the logic high level signal appearing on the enable inputs thereof, and the logic low level signal appearing on the disable inputs thereof via inverting buffer 86, such that the $\phi1$ clock signal is applied to the B(I) output terminal and the $\phi2$ clock signal is applied to the R(I) output terminal.

As discussed above, the symmetrical capacitor pairs in prior art analog FIR filters were typically imperfectly matched due to variations in processing steps. Hence, the coefficients in the resulting transfer function were not perfectly or symmetrically matched, resulting in non-linear phase response, incomplete attenuation by the filter at the frequencies characterized by the zeroes of the transfer function, and as a result, non-constant group delay (group delay is designaed by the derivative of phase with respect to frequency).

FIG. 5A, is a phase response graph of the successful prototype of the FIR filter according to the present invention characterized by the transfer function $$H(z) = [2.98 + 3.739z^{-1} + 2.153z^{-2} - 1.167z^{-3}$$
$$-5.707z^{-4} - 10.662z^{-5} - 15.367z^{-6}$$
$$-18.779z^{-7} + 15.367z^{-8} - 10.662z^{-9}$$
$$-5.707z^{-10} - 1.167z^{-11} + 2.153z^{-12}$$
$$-3.739z^{-13} + 2.98z^{-14}]/66.84$$

The phase response is seen to be linear. However, a filter implemented according to prior art analog techniques typically exhibits up to 10% differential error in capacitor area matching. For example, imperfections in the fabrication process could result in a 10% differential error between the $z^{-5}$ and $z^{-9}$ coefficients, (i.e. $-9.662z^{-5}$ and $-11.662z^{-9}$ instead of $10.662z^{-5}$ and $10.662z^{-9}$). The resulting phase response is illustrated in FIG. 5B. Accordingly, it is seen that a mere 10% differential error in a single coefficient pair results in considerable loss of linearity, which contributes to intersymbol interference during transmission.

In summary, the present invention is a symmetric FIR filter utilizing both digital and analog technology. A digital input signal is received and a digitally filtered analog output signal is generated in response thereto. The analog portion of the filter is implemented utilizing a switched capacitor array fabricated from CMOS technology. By using a switched capacitor array, the present invention operates at very high speeds, (i.e. in real time), and the power consumption of the filter is very low. Advantage is taken of the symmetrical characteristics of the filter in order to implement a plurality of digital processing circuits for processing the digital input signal in order to eliminate unnecessary multiplications, characterized by discharging predetermined ones of the capacitors in the switched capacitor array.

The number of capacitors required to implement the analog portion has been reduced to approximately one-half of the number utilized in prior art analog FIR filters.

The filter according to the present invention is particularly useful for transmission of digital signals along a balanced line, such as a twisted tip and ring lead pair.

The digital signal has been described herein as being comprised of "data bits". However, it will be understood that the signal could be comprised of PCM voice bits, etc.

The successful prototype was incorporated in a single VLSI digital network line interface circuit for providing bidirectional transmission of digital signals between a digital communications system (such as a PABX) and one or more digital peripheral circuits connected thereto via twisted tip and ring lead pairs.

Numerous other variations or alternative embodiments may now be conceived of by a person skilled in the art understanding the present invention. For instance, while the preferred embodiment has been described as having fifteen coefficients (i.e. an odd order filter), an even order filter can be implemented by simply eliminating "T" type circuit 8 shown in FIG. 1, and interconnecting the Q(I) output terminal of circuit 7 to the D(N-I) input terminal thereof. Similarly, any suitable number and combination of positive and negative coefficients are accommodated by appropriate selection of "P" and "M" type circuits to implement FIR filters of various orders.

These and all other embodiments or variations in design using the principles disclosed herein are considered to be within the sphere and scope of the invention as defined in the claims appended hereto.

I claim:

1. A symmetric finite impulse response filter characterized by a predetermined transfer function having a plurality of predetermined symmetric coefficient pairs, comprised of:

(a) means for receiving an input signal, said input signal comprising a sequence of bits having predetermined logic levels;

(b) a plurality of capacitors, having respective capacitances proportional to corresponding ones of said coefficient pairs, and with each capacitor of said plurality having its first terminal connected to the first terminals of each of the other said plurality of capacitors;

(c) means for successively detecting the logic levels of said received bits and successively charging first predetermined ones of said capacitors to one of a positive or negative voltage via second terminals of said capacitors in the event individual bits of first predetermined pairs of said received bits corresponding to first predetermined ones of said corresponding coefficient pairs have the same logic level, and maintaining further ones of said capacitors discharged in the event individual bits of further predetermined pairs of said received bits corresponding to further predetermined ones of said corresponding coefficient pairs have opposite logic levels; and (d) means connected to said first terminals of said plurality of capacitors for successively summing the voltages of said capacitors and generating an output signal in response to said summing, whereby said output signal is an analog version of said digital input signal filtered according to said predetermined transfer function.

2. A symmetric finite impulse response filter as defined in claim 1 being of odd order and characterized by a transfer function having an additional coefficient, further including an additional capacitor having a capacitance approximately equal in value to said additional coefficient and said additional capacitor having a first terminal connected to said means for successively summing the voltages of said plurality of capacitors, and means for successively detecting the logic level of an additional bit of said sequence of bits corresponding to said additional coefficient and successively charging said additional capacitor to one of said positive or negative voltage in response to said logic level being detected.

3. A symmetric finite impulse response filter as defined in claim 2, wherein said means for receiving said input signal is comprised of a plurality of serially connected shift registers for storing and shifting successive ones of said bits.

4. A symmetric finite impulse response filter as defined in claim 2, further comprised of:

(e) a reference voltage source, (f) a bias voltage source, (g) first switch means for connecting said first terminals of said capacitors alternately between said bias voltage source and said means for successively summing voltages of said capacitors, and (h) a plurality of second switch means connected to said means for detecting the logic levels of said received bits, for connecting individual ones of said second terminals of said capacitors alternately between said source of bias voltage and said source of reference voltage in phase with said first switch means in the event said first corresponding pairs of bits are of a first predetermined one of said logic levels, whereby said capacitors are charged to one of either said positive or negative voltage, and connecting said individual ones of said second terminals alternately between said source of bias voltage and said source of reference voltage in opposite phase to said first switch means in the event said first corresponding pairs of bits are of a second opposite one of said logic levels, whereby said capacitors are charged to an opposite one of said positive or negative voltage.

5. A symmetric finite impulse response filter as defined in claim 2, wherein said means for successively summing voltages on said capacitors is comprised of an integrator circuit having an input connected to said first terminals of said capacitors and having an output for carrying said output signal.

6. A symmetric finite impulse response filter as defined in claim 1, wherein said respective capacitances of said plurality of capacitors are approximately equal in value to twice the value of either of the coefficients of said corresponding coefficient pairs.

7. A symmetric finite impulse response filter as defined in claim 6, wherein said means for receiving said input signal is comprised of a plurality of serially connected shift registers for storing and shifting successive ones of said bits.

8. A symmetric finite impulse response filter as defined in claim 6, further comprised of:

(e) a reference voltage source, (f) a bias voltage source, (g) first switch means for connecting said first terminals of said capacitors alternately between said bias voltage source and said means for successively summing voltages of said capacitors, and (h) a plurality of second switch means connected to said means for detecting the logic levels of said received bits, for connecting individual ones of said second terminals of said capacitors alternately between said source of bias voltage and said source of reference voltage in phase with said first switch means in the event said first corresponding pairs of bits are of a first predetermined one of said logic levels, whereby said capacitors are charged to one of either said positive or negative voltage, and connecting said individual ones of said second terminals alternately between said source of bias voltage and said source of reference voltage in opposite phase to said first switch means in the event said first corresponding pairs of bits are of a second opposite one of said logic levels, whereby said capacitors are charged to an opposite one of said positive or negative voltage.

9. A symmetric finite impulse response filter as defined in claim 6, wherein said means for successively summing voltages on said capacitors is comprised of an integrator circuit having an input connected to said first terminals of said capacitors and having an output for carrying said output signal.

10. A symmetric finite impulse response filter as defined in claim 1, wherein said means for receiving said input signal is comprised of a plurality of serially connected shift registers for storing and shifting successive ones of said bits.

11. A symmetric finite impulse response filter as defined in claim 1, further comprised of:

(e) a reference voltage source, (f) a bias voltage source, (g) first switch means for connecting said first terminals of said capacitors alternately between said bias voltage source and said means for successively summing voltages of said capacitors, and (h) a plurality of second switch means connected to said means for detecting the logic levels of said received bits, for connecting individual ones of said second terminals of said capacitors alternately between said source of bias voltage and said source of reference voltage in phase with said first switch means in the event said first corresponding pairs of bits are of a first predetermined one of said logic levels, whereby said capacitors are charged to one of either said positive or negative voltage, and connecting said individual ones of said second terminals alternately between said source of bias voltage and said source of reference voltage in opposite phase to said first switch means in the event said first corresponding pairs of bits are of a second opposite one of said logic levels, whereby said capacitors are charged to an opposite one of said positive or negative voltage.

12. A symmetric finite impulse response filter as defined in claim 1, wherein said means for successively summing voltages on said capacitors is comprised of an integrator circuit having an input connected to said first terminals of said capacitors and having an output for carrying said output signal.

13. A symmetric finite impulse response filter characterized by a predetermined transfer function having a plurality of positive and negative coefficient pairs, comprised of:

(a) a plurality of serially connected shift registers for receiving and storing an input sequence of bits, (b) a plurality of first and second digital processing circuits connected to first and second predetermined ones of said shift registers, for detecting logic levels of first and second predetermined pairs of said received bits corresponding to respective ones of said positive and negative coefficient pairs, and generating control signals in response to the logic levels detected, (c) a plurality of capacitors having respective capacitances proportional to corresponding ones of said coefficient pairs, and each of said capacitors having its first terminal connected to the first terminal of each of the other said plurality of capacitors, (d) a plurality of switch means connected to respective ones of said plurality of first and second digital processing circuits and second terminals of respective ones of said capacitors, for receiving said control signals, (i) charging first predetermined ones of said capacitors to a positive voltage in response to reception of a first predetermined one of said control signals, (ii) charging second predetermined ones of said capacitors to a negative voltage in response to reception of said second predetermined one of a control signals, and (iii) discharging further predetermined ones of said capacitors in response to reception of a third predetermined one of said control signals, and (e) integrator means connected in a circuit to said first terminals of the capacitors for receiving and summing the voltages on said capacitors and generating an analog output signal in response to said summing, whereby said charging and discharging of said capacitors filters said input sequence of bits according to said transfer function and said integrator means converts said filtered sequence of bits to analog form.

14. A symmetric finite impulse response filter as defined in claim 13 being of odd order and characterized by a transfer function having an additional coefficient, further including:

(a) an additional shift register connected in series with said plurality of shift registers, for receiving and storing an additional bit of said sequence of bits, said additional bit having a predetermined logic level, (b) an additional digital processing circuit connected to said additional shift register, for detecting the logic level of said additional bit, and generating one of said first and second predetermined control signals in response to detecting said logic level, (c) an additional capacitor having a capacitance approximately equal in value to said additional coefficient, and said additional capacitor having a first terminal connected to said integrator means, and (d) additional switch means connected to said additional digital processing circuit and a second terminal of said additional capacitor, for receiving said control signals, (i) charging said additional capacitor to a positive voltage in response to reception of said first predetermined control signal, and (ii) charging said additional capacitor to a negative voltage in response to reception of said second predetermined control signal.

15. A symmetric finite impulse response filter as defined in claim 14, wherein said additional digital processing circuit is further comprised of:

(a) a first logic circuit for generating said second predetermined control signal in response to detecting a logic low level of said additional bit, and (b) a second logic circuit for generating said first predetermined control signal in response to detecting a logic high level of said additional bit.

16. A symmetric finite impulse response filter as defined in claim 15, wherein said integrator circuit is comprised of an operational amplifier and a further capacitor connected to an input and output of the operational amplifier, said input being connected in a circuit to said first terminals of said plurality of capacitors.

17. A symmetric finite impulse response filter as defined in claim 15, further including an attenuating capacitor connected between said first terminal of said plurality of capacitors and said integrator means, for attenuating said voltages received by the integrator means.

18. A symmetric finite impulse response filter as defined in claim 13, wherein each of said plurality of first digital processing circuits is further comprised of:

(a) a first logic circuit for generating said first predetermined control signal in response to detecting logic low levels of individual bits of a corresponding one of said predetermined pairs of received bits, (b) a second logic circuit for generating said second predetermined control signal in response to detecting logic high levels of said individual bits of the corresponding predetermined pair of received bits, and (c) a third logic circuit for generating said third predetermined control signal in response to detecting opposite logic levels of said individual bits of the corresponding predetermined pair of received bits.

19. A symmetric finite impulse response filter as defined in claim 18, wherein said integrator circuit is comprised of an operational amplifier and a further capacitor connected to an input and output of the operational amplifier, said input being connected in a circuit to said first terminals of said plurality of capacitors.

20. A symmetric finite impulse response filter as defined in claim 18, further including an attenuating capacitor connected between said first terminal of said plurality of capacitors and said integrator means, for attenuating said voltages received by the integrator means.

21. A symmetric finite impulse response filter as defined in claim 18, wherein said respective capacitances of said plurality of capacitors are approximately equal in value to twice the value of either of the coefficients of said corresponding coefficients pairs.

22. A symmetric finite impulse response filter as defined in claim 13, wherein each of said plurality of second digital processing circuits is further comprised of:
(a) a first logic circuit for generating said second predetermined control signal in response to detecting logic low levels of individual bits of a corresponding one of said predetermined pairs of received bits,
(b) a second logic circuit for generating said first predetermined control signal in response to detecting logic high levels of said individual bits of the corresponding predetermined pair of received bits, and
(c) a third logic circuit for generating said third predetermined control signal in response to detecting opposite logic levels of said individual bits of the corresponding predetermined pair of received bits.

23. A symmetric finite impulse response filter as defined in claim 22, wherein said respective capacitances of said plurality of capacitors are approximately equal in value to twice the value of either of the coefficients of said corresponding coefficient pairs.

24. A symmetric finite impulse response filter as defined in claim 23, wherein sid integrator circuit is comprised of an operational amplifier and a further capacitor connected to an input and output of the operational amplifier, said input being connected in a circuit to said first terminals of said plurality of capacitors.

25. A symmetric finite impulse response filter as defined in claim 22, further including an attenuating capacitor connected between said first terminal of said plurality of capacitors and said integrator means, for attenuating said voltages received by the integrator means.

26. A symmetric finite impulse response filter as defined in claim 13, wherein said respective capacitances of said plurality of capacitors are approximately equal in value to twice the value of either of the coefficients of said corresponding coefficient pairs.

27. A symmetric finite impulse response filter as defined by claim 13, wherein said plurality of switch means are comprised of a plurality of transistor pairs, each of said transistor pairs having first terminals connected to the second terminals of said capacitors, and having second terminals connected to sources of positive and negative voltages respectively, and having control inputs connected to respective ones of said logic circuits.

28. A symmetric finite impulse response filter as defined in claim 27, wherein said first control signal is comprised of a pair of non-overlapping clock signals for application to respective control inputs of said transistor pairs, said second control signal is comprised of an opposite phase version of said pair of non-overlapping clock signals for application to said respective control inputs, and said third control signal is comprised of logical '1' and logical '0' voltages for application to said respective control inputs.

* * * * *